US007777525B2

United States Patent
Adil et al.

(12) United States Patent
(10) Patent No.: US 7,777,525 B2
(45) Date of Patent: Aug. 17, 2010

(54) INPUT BUFFER IN ULTRADEEP SUBMICRON PROCESS

(75) Inventors: Praveen Adil, Bangalore (IN); Shakti Shankar Rath, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 451 days.

(21) Appl. No.: 11/379,381

(22) Filed: Apr. 20, 2006

(65) Prior Publication Data

US 2008/0048721 A1 Feb. 28, 2008

(51) Int. Cl.
*H03K 19/003* (2006.01)
(52) U.S. Cl. .............................. 326/81; 326/68; 326/83; 327/108
(58) Field of Classification Search ............. 326/62–63, 326/68, 80–83, 86; 327/108–109, 333
See application file for complete search history.

(56) References Cited

U.S. PATENT DOCUMENTS 6,127,841 A * 10/2000 Roohparvar ................. 326/34

6,288,590 B1 * 9/2001 Sandhu ........................ 327/318
6,346,829 B1 * 2/2002 Coddington .................. 326/81
6,362,652 B1 * 3/2002 Oner et al. .................... 326/81
6,949,964 B2 * 9/2005 Ajit ............................. 327/108

OTHER PUBLICATIONS

Jozef C. Mitros, Chin-yu Tsai, Hisashi Shichijo, Keith Kunz, Alec Morton, Doug Goodpaster, Dan Mosher, and Taylor R. Efland, "High-Voltage Drain Extended MOS Transistors for 0.18-um Logic CMOS Process", Aug. 2001, IEEE Transactions on Electron Devices, vol. 48, No. 8, p. 1-5.*
Jozef C. Mitros, "High-Voltage Drain Extended MOS Transistors for 0.18 um Logic CMOS Process" Aug. 2001, IEEE vol. 48, No. 8, p. 1-5.*

* cited by examiner

*Primary Examiner*—James H. Cho
*Assistant Examiner*—Christopher Lo
(74) *Attorney, Agent, or Firm*—John J. Patti; Wade J. Brady, III; Frederick J. Telecky, Jr.

(57) ABSTRACT

An input buffer for an Ultradeep Sub Micron (UDSM) process which allows the UDSM process to interface with a 3V input. The input voltage is applied to a degenerated transistor which forms part of the input buffer. The input buffer effectively drops the input voltage to a voltage suitable for use by the core of the UDSM process.

8 Claims, 3 Drawing Sheets

INPUT BUFFER IN ULTRADEEP SUBMICRON PROCESS

TECHNICAL FIELD

The present invention relates to input buffers for Ultradeep Sub Micron (UDSM) processes and their voltage interfaces.

BACKGROUND

Modern wireless handsets are required to interface with many peripherals to provide the diverse functionality required of modern communications. One such peripheral is a Multimedia Card (MMC) which allows storage of data from many different devices.

In wireless handsets, 3V I/O operation at 50 MHz is required to communicate with these cards. Since the application processor resides on an Ultradeep Sub Micron (UDSM) process, the I/O buffers need to be designed in these processes. However, UDSM processes do not have 3V transistors in the default mask set, interfacing to a 3V input is difficult.

Various aspects of UDSM technology are described in the article "Full Chip Verification of UDSM Designs", R. Saleh et al., Proceedings of 1998 IEEE/ACM International Conference on Computer Aided Design, pp. 453-460, the teachings of which are hereby incorporated by reference.

It is therefore an object of the present invention to design an input buffer for a UDSM process that can interface with higher input voltages.

SUMMARY OF THE INVENTION

According to one aspect of the present invention, there is provided an input buffer for interfacing an input voltage to an Ultradeep Sub Micron (UDSM) process having a core capable of operating at a core voltage, lower than the input voltage, the input buffer comprising an input transistor for receiving the input voltage, wherein the input transistor is a degenerated transistor.

In one aspect, the degenerated transistor is a degenerated drain extended transistor. In one form of this aspect, the degenerated drain extended transistor is degenerated by a second transistor.

In another form of the present invention, the input buffer further comprises a third transistor, which in combination with the second transistor causes the input transistor to enter linear mode when the input signal is high and to enter sub-threshold mode when the input signal is low.

In one arrangement, the drain of the second transistor is connected to the source of the input transistor, the gate of the second transistor is connected to the source of the third transistor and the drain of the first transistor is connected to the gate of the third transistor. The gate of the second transistor may be connected to the gate of the third transistor via a capacitor.

According to another aspect of the present invention, there is provided a method of interfacing an input voltage to an Ultradeep Sub Micron (UDSM) process having a core capable of operating at a core voltage, lower than the input voltage, the method comprising applying the input voltage to a transistor of an input buffer of the UDSM, wherein the input transistor is a degenerated transistor.

In a further form, the method comprises causing the input transistor to enter linear mode when the input signal is high and to enter subthreshold mode when the input signal is low, thereby providing an upper limit for a voltage applied to the core.

According to another aspect of the present invention, there is provided an Ultradeep Sub Micron (UDSM) process comprising the input buffer of the present invention.

BRIEF DESCRIPTION OF THE DRAWINGS

The invention will now be described in detail with reference to the following figures in which.

DETAILED DESCRIPTION

The present invention will now be described in detail with reference to one or more embodiments of the invention, examples of which are illustrated in the accompanying drawings. The examples and embodiments are provided by way of explanation only and are not to be taken as limiting to the scope of the invention. Furthermore, features illustrated or described as part of one embodiment may be used with one or more other embodiments to provide a further new combination.

It will be understood that the present invention will cover these variations and embodiments as well as variations and modifications that would be understood by a person skilled in the art.

Figure 1:
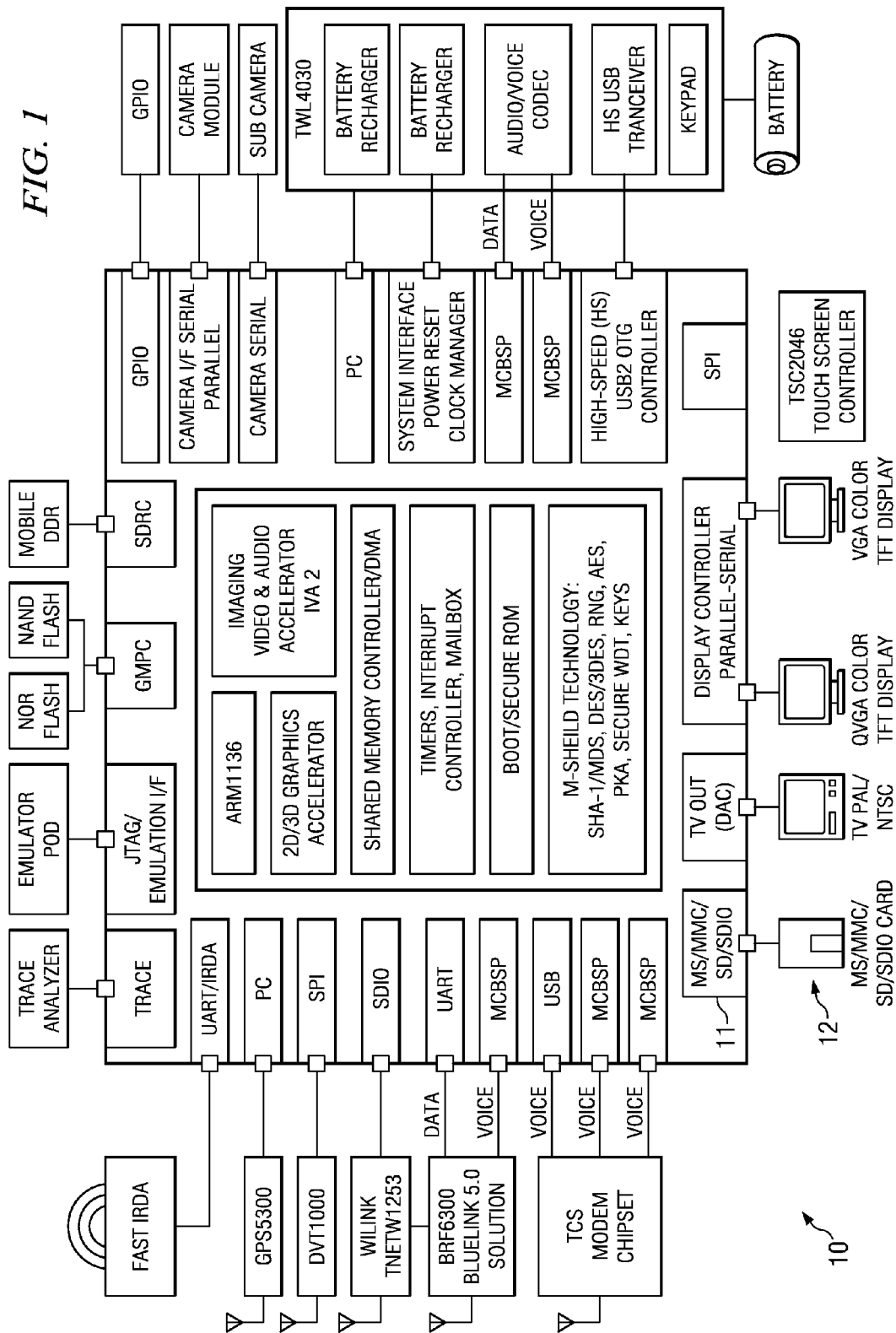
FIG. 1 shows an exemplary application for the present invention in an applications processor.

FIG. 1 shows an applications processor 10 for use in a wireless communications handset such as 2.5 G and 3 G wireless handsets and multimedia-enabled wireless PDAs. The processor 10 provides capability such as video conferencing, digital music, mobile-to-mobile gaming and mobile TV. The processor also integrates a 330 MHz ARM1136 RISC processor core, dedicated 2D/3D graphics hardware acceleration, high-speed system interconnect, a host of peripherals, and camera, display and memory subsystems.

As can be seen in FIG. 1, application processor 10 also interfaces with Multimedia Card (MMC) 12 at SD/SDIO 11. It is at this location that the present invention may be applied, although it will be noted that the invention could also be applied to Personal Computer Memory Card International Association (PCMCIA), UMTS Subscriber Identification Module (USIM) Interfaces as well as other interfaces and processors.

UDSM processes contain transistors capable of taking about 1.8V across the gate terminal and about 3.3V across the drain source terminals. These transistors are known as drain extended transistors. An aspect of the invention uses these existing drain extended transistors to design the 3V input buffer.

In one embodiment, the input buffer is designed to take an I/O VDD supply ranging from 2.7V to 3.3V. The $V_{IL}$ for the input buffer ranges from $-0.3V$ to $0.3*VDDIO$. The $V_{IH}$ for the input buffer ranges from $0.7*VDDIO$ to $VDDIO+0.3$. The input buffer therefore has to detect voltages ranging from $-0.3V$ to $0.99V$ as low, and voltages ranging from $1.89V$ to $3.6V$ as high. It will be appreciated that the difference between $V_{IL(max)}$ and $V_{IH(min)}$ is only $0.9V$.

According to one aspect of the present invention, the input signal is coupled to the core of the UDSM process via the gate of a degenerated drain extended transistor. However, the input signal should ideally be coupled through the gate when the source of the transistor is not grounded. The source may be raised from ground by the use of another device.

Figure 2:
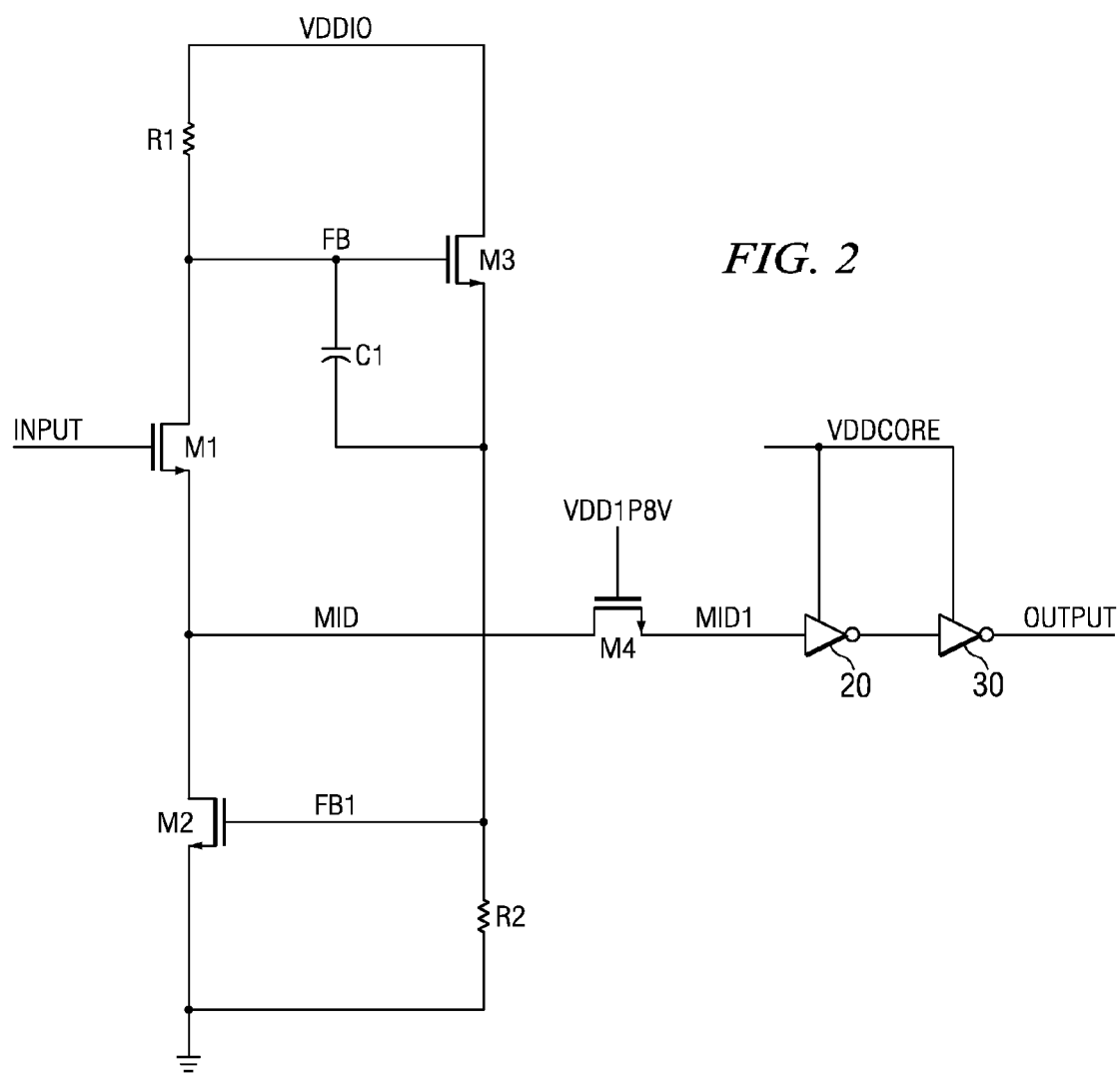
FIG. 2 shows a circuit diagram of one embodiment of the present invention.

The circuit as shown in FIG. 2 shows such an arrangement and provides the following functionality. Firstly, it couples the input signal through a degenerated transistor M1. Secondly, the drive of the input transistor M1 scales with the input signal, and thirdly, the circuit shifts the level of the input signal down to the core logic level, shown as VDDCORE.

In this configuration, transistor M2 degenerates the input transistor M1. The source of the input transistor M1 is a very low impedance node (designated as "MID" in FIG. 2). It can be shown that the impedance $R_{out}$ at this node is given by the equation:

$$R_{out} = (g_{m2}/g_{ds2})/g_{m1} \qquad (1)$$

where the subscript number refers to the transistor number in FIG. 2

Since MID is a low impedance node, it responds very quickly to the input signal. Whenever the input signal goes high, MID follows the input signal due to the low impedance.

Due to the configuration of the transistors M2 and M3, transistor M1 goes into linear mode when the input signal goes very high. This limits the value of MID to $2(V_T+V_{GST})$ (where $V_T$ is the threshold voltage of the transistor). This can be designed to be within 1.8V. When the input signal is only at $V_{IH(min)}$, transistor M1 enters saturation mode and the MID node goes to $V_{INPUT}-V_T$. This is high enough to be detected as a high by a first inverter 20. When the input signal goes low, transistor M1 cuts off, causing the current in resistor R1 to go to zero.

When this happens, node FB goes towards the VDDIO voltage, which is coupled to node FB1 through transistor M3. This then significantly increases the drive voltage of transistor M2, which then quickly pulls down the MID node.

The node MID is coupled to the core inverters 20 and 30 using transistor M4. This transistor ensures that the node MID1 (the input to the core inverters) is always lower than $1.8-V_T(M4)$, which is within core transistor reliability limits.

Figure 3:
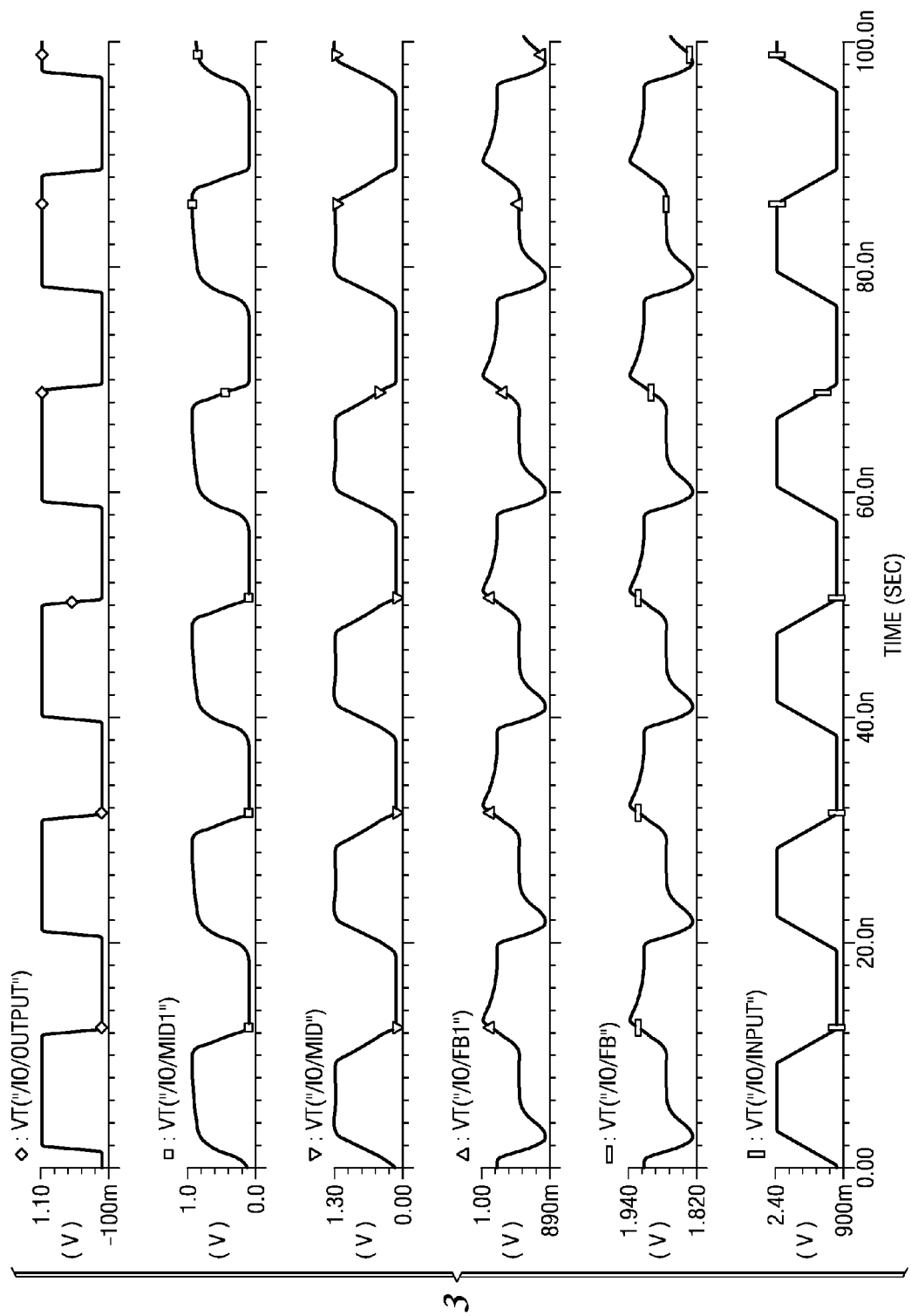
FIG. 3 shows various waveforms at different nodes in the circuit of FIG. 2.

Capacitor C1 is also provided at nodes FB and FB1 to increase the speed of coupling between these nodes.

the circuit of FIG. 2, exemplary component parts and values are as follows:
M1—DENMOS_1P8V
M2—DENMOS_1P8V
M3—DENMOS_1P8V
M4—DENMOS_1P8V
R1—60 k
R2—300 k FIG. 3 shows various simulated waveforms appearing at the nodes INPUT, FB, MID, MID1 and OUTPUT in the circuit of FIG. 2. It can be seen that the voltage at the output clearly mirrors the voltage at the input, but is shifted from a maximum voltage of 2.4V to a maximum voltage of 1.1V suitable for use by the core.

The invention claimed is:

1. An input buffer for interfacing an input voltage to an Ultradeep Sub Micron (UDSM) process having a core capable of operating at a core voltage, lower than the input voltage, the input buffer comprising:
   first transistor for receiving the input voltage;
   a second transistor for degenerating the first transistor, wherein the second transistor is connected to a source of the first transistor at its drain;
   a third transistor that is connected to a gate of the second transistor at its source and that is coupled to the drain of the first transistor at its gate, wherein the third transistor, in combination with the second transistor, causes the first transistor to enter linear mode when the input signal is high and to enter subthreshold mode when the input signal is low; and
   a capacitor that is connected between the gate of the second transistor and the gate of the third transistor.

2. The input buffer as claimed in claim 1, wherein the first transistor is a drain extended transistor.

3. The input buffer as claimed in claim 1, further comprising at least one inverter coupled between an output and the source of the first transistor, for shifting a voltage developed at a node between the first transistor and the second transistor down to a core logic voltage level.

4. The method as claimed in claim 3, wherein the first transistor is a drain extended transistor.

5. The input buffer as claimed in claim 3, further comprising a fourth transistor connected between the source of the first transistor and an input of the at least one inverter, for limiting the voltage applied to the input of the at least one inverter.

6. An apparatus comprising: a voltage rail; a first resistor that is connected to the voltage rail; an first NMOS first transistor that receives an input signal at its gate and that is connected to the first resistor at its drain; a second NMOS transistor that is connected to the source of the first NMOS transistor at its drain and that is connected to ground at its source; a third NMOS transistor that is connected to the voltage rail at its drain, that is coupled to the drain of the first NMOS transistor at its gate, and that is connected to the gate of the second transistor at its source; a capacitor that is connected between source and gate of the third NMOS transistor; and a second resistor that is connected between the drain of the third NMOS transistor and ground.

7. The apparatus as claimed in claim 6, wherein the apparatus further comprises a first PMOS transistor that is connected to the source of the first NMOS transistor at its drain.

8. The apparatus as claimed in claim 7, wherein the apparatus further comprises an inverter that is connected to the source of the first PMOS transistor.

* * * * *